United States Patent
Shackleford et al.

(10) Patent No.: US 7,082,453 B1
(45) Date of Patent: Jul. 25, 2006

(54) LONG-PERIOD COUNTER WITHOUT CARRIES

(75) Inventors: J. Barry Shackleford, Portola Valley, CA (US); Richard J. Carter, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 726 days.

(21) Appl. No.: 10/255,611

(22) Filed: Sep. 27, 2002

(51) Int. Cl.
*G06F 7/50* (2006.01)

(52) U.S. Cl. ..................................... 708/672
(58) Field of Classification Search ................ 708/252, 708/672, 272
See application file for complete search history.

(56) References Cited

U.S. PATENT DOCUMENTS 3,761,696 A * 9/1973 Russell ........................ 708/252

OTHER PUBLICATIONS

Alfke, Peter, "Efficient shift registers, LFSR counters, and long pseudo-random sequence generators", Jul. 7, 1996, p.p. 1-6, Xilinx.

* cited by examiner

*Primary Examiner*—D. H. Malzahn

(57) ABSTRACT

The present invention is a counter that takes advantage of the speed and implementation of the LFSR counter by utilizing separate digit counters, each digit counter having a period that is a relative prime to the other digit counter periods. The total period will be the product of all the digit counter periods. Since all digits count independently, there is no carry structure between the digits and hence no delay incurred by carry chains. The pseudorandom number counting sequence for each digit still occurs but is ameliorated by the fact that the digital periods are small and can readily be converted to decimal equivalents by table-lookup and residue lookup.

8 Claims, 3 Drawing Sheets

LONG-PERIOD COUNTER WITHOUT CARRIES

TECHNICAL FIELD OF THE INVENTION

This invention relates generally to the field of digital counting circuits, and more specifically to high-speed counting circuits that can count for arbitrarily long periods without engendering the circuit delays common to conventional counters.

BACKGROUND

There are approximately $2^{55}$ nanoseconds in a year. This means that any high-speed circuit running at a clock rate of 1 GHz would need at least a 55-bit counter to log events with respect to time for one year. Situations involving such long-period counters such as long-term environmental monitoring or long-term simulations using application-specific computational circuits are readily imagined. Ordinary binary counters are problematic in that they engender long propagation delays, thus slowing the entire circuit. As shown in FIG. 1, the conventional counter generates overall carry propagation delays between each bit that slow the overall clock speed of the circuit. In a 55-bit counter, this propagation delay caused by the carry is significant and unacceptable.

This problem can be mitigated by using a "carry-look-ahead" structure as found in conventional addition circuits, but the problem still remains and the circuits require a substantial amount of both wiring and logic gates.

Another possibility for a long-period high-speed counter is the linear feedback shift register or LFSR, as shown in FIG. 2. The main problem with the LFSR is that the counting sequence is pseudorandom, and it is not possible to determine the actual count from the sequence directly, but rather the count must be simulated. For long-period applications this is highly problematic. From the standpoint of circuit implementation, however, it is a highly desirable circuit due to most bits having direct connections and not requiring any carry logic. An LFSR takes less resources and frequently runs much faster than a conventional counter.

A linear feedback shift register generally consists of two or more D-type flip-flops and one or more exclusive-OR (XOR) or exclusive-NOR (XNOR) gates. The flip-flops form a shift register. A shift register is a device whose identifying function is to shift its contents into adjacent positions within the register or, in the case of the position on the end, out of the register. The position on the other end is left empty unless some new content is shifted into the register. The contents of a shift register are usually binary, that is, ones and zeroes. If a shift register contains the bit pattern 1101, a shift, in this case to the right, would result in the contents being 0110; another shift yields 0011. Whether it shifts right or left does not really matter and is usually determined by the requirements of the circuit that the LFSR is driving or the method that it is being constructed by. In applications such as cryptology, the shift register can be preset to a known initial condition. but in general they are either set to all zeros except for one bit, or set to all ones except for one bit.

In an LFSR, the bits contained in selected positions in the shift register are combined in some sort of function and the result is fed back into the register's input bit. By definition, the selected bit values are collected before the register is clocked and the result of the feedback function is inserted into the shift register during the shift, filling the position that is emptied as a result of the shift.

For example, in an LFSR with an XOR gate, the feedback input is created by adding the selected bit values. If the sum is odd, the feedback input is one; otherwise the input is zero. If XORs are used to generate the feedback input to the shift register, then the state of all zeros is not allowed as the system would never leave the all zero state. If XNORs are used, then the state of all ones is not allowed for the same reasons. The choice largely depends on how the LFSR is being implemented.

The bit positions selected for use in the feedback function are called "taps." The list of the taps is known as the "tap sequence." By convention, the output bit of an LFSR that is n bits long is the nth bit; the input bit of an LFSR is bit 1.

LFSR are not truly random devices because after a certain number of cycles, the cycle out of the LFSR will repeat, hence they are termed "pseudo-random devices." The maximum number of cycles before the cycle repeats can be determined by the formula: $2^n-1$, where n represents the number of flip-flops. The term $2^n-1$ comes from the fact that either the all-zero or all-one state is disallowed.

The placement of the XOR/XNOR taps determine the bit sequence of the noise generated. A poor selection of taps can lead to a LFSR that has a cycle length much less than the $2^n-1$ maximum.

The numbers below show the hexadecimal value out of a 17-bit LFSR initialized to a value of 10000 shifting right for the first 64 cycles:

10000, 08000, 04000, 02000, 01000, 00800, 00400, 00200, 00100, 00080, 00040, 00020, 10010, 08008, 04004, 02002, 01001, 10800, 08400, 04200, 02100, 01080, 00840, 00420, 10210, 08108, 04084, 02042, 01021, 00810, 00408, 00204, 00102, 00081, 10040, 08020, 14010, 0A008, 05004, 02802, 01401, 10A00, 08500, 04280, 02140, 010A0, 10850, 08428, 14214, 0A10A, 05085, 12842, 09421, 04A10, 02508, 01284, 00942, 004A1, 00250, 10094, 0804A, 04025, 02012 . . .

The most important properties of an LFSR are that it has a low (constant) gate delay, and more importantly, if the taps are chosen properly, repeated shifting (starting with any non-zero value) will cycle through every possible non-zero value of the register. A 55-bit maximal-length LFSR would create over $2^{55}-1$ patterns that, at a 1-GHz clock rate, would take roughly a year to generate the whole pattern set. The problem with the LFSR counter is that is not possible to derive the decimal value of the count from the LFSR's value—direct enumerative simulation is required which is often problematic due to the long simulation times required.

Therefore, while a long-period counter using an LFSR is fast and does not use a large amount of logic gates, the counter, due to its pseudorandom nature, does not produce useful numbers for counting. All LFSR counters suffer from this and are not best-suited for use as long-period counters.

SUMMARY

The present invention takes advantage of the speed and implementation of the LFSR counter by utilizing separate digit counters, each digit counter having a period that is a relative prime to the other digit counter periods. The total period will be the product of all the digit counter periods. Since all digits count independently, there is no carry structure between the digits and hence no delay incurred by carry chains. The pseudorandom number counting sequence for each digit still occurs but is ameliorated by the fact that the digital periods are small and can readily be converted to decimal equivalents by table-lookup and residue arithmetic.

DESCRIPTION OF THE DRAWINGS

The features, aspects, and advantages of the present invention will become better understood with regard to the following description, appended claims, and accompanying drawings where:

DETAILED DESCRIPTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the spirit and scope of the invention. The present invention is not intended to be limited to the embodiments shown, but is to be accorded the widest possible scope consistent with the principles and features disclosed herein.

The present invention is directed to a long-period high-speed counter that has no circuit delays from carry digits. Conventional counters have long propagation delays caused by carry digits that slow the clock speed of the circuit. Counters using long-period LFSR counters, with a large number of registers, have significantly less propagation delay, but the output of the counter is pseudorandom and not in a useful format.

Figure 1:
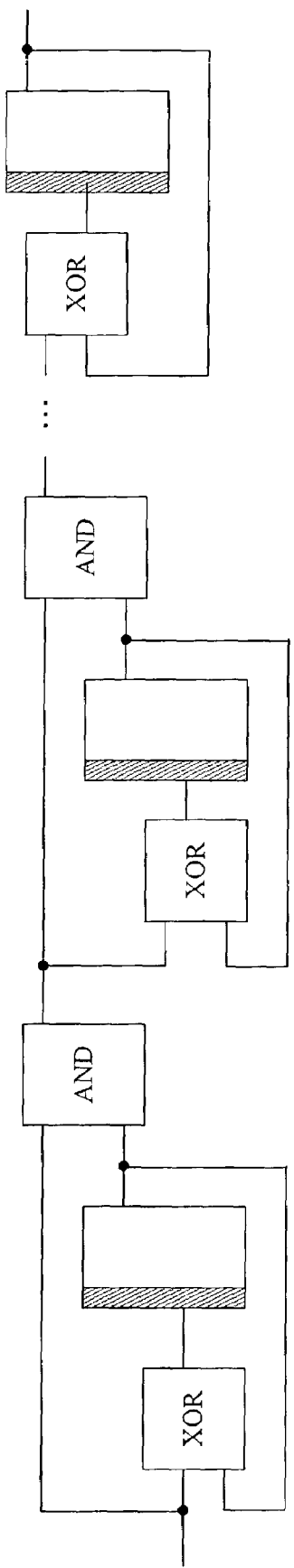
FIG. 1 depicts a circuit diagram of a conventional counter.
Figure 2:
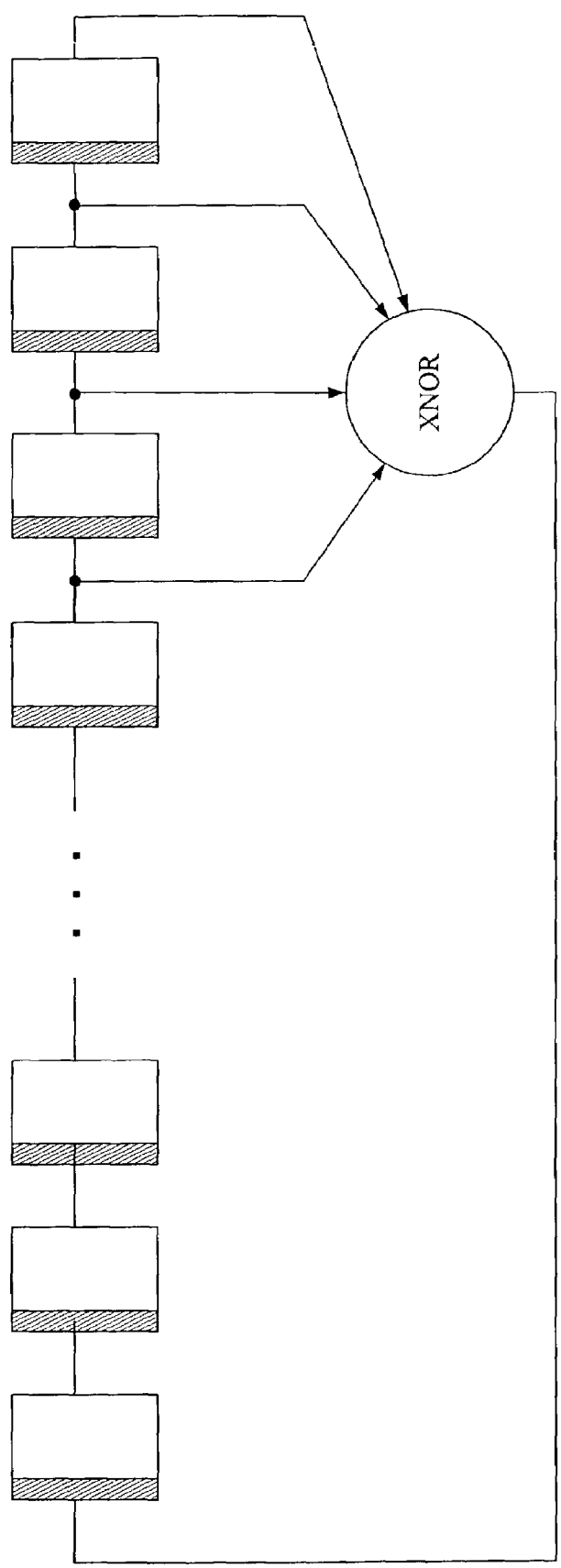
FIG. 2 depicts a circuit diagram of a conventional LFSR counter.
Figure 3:
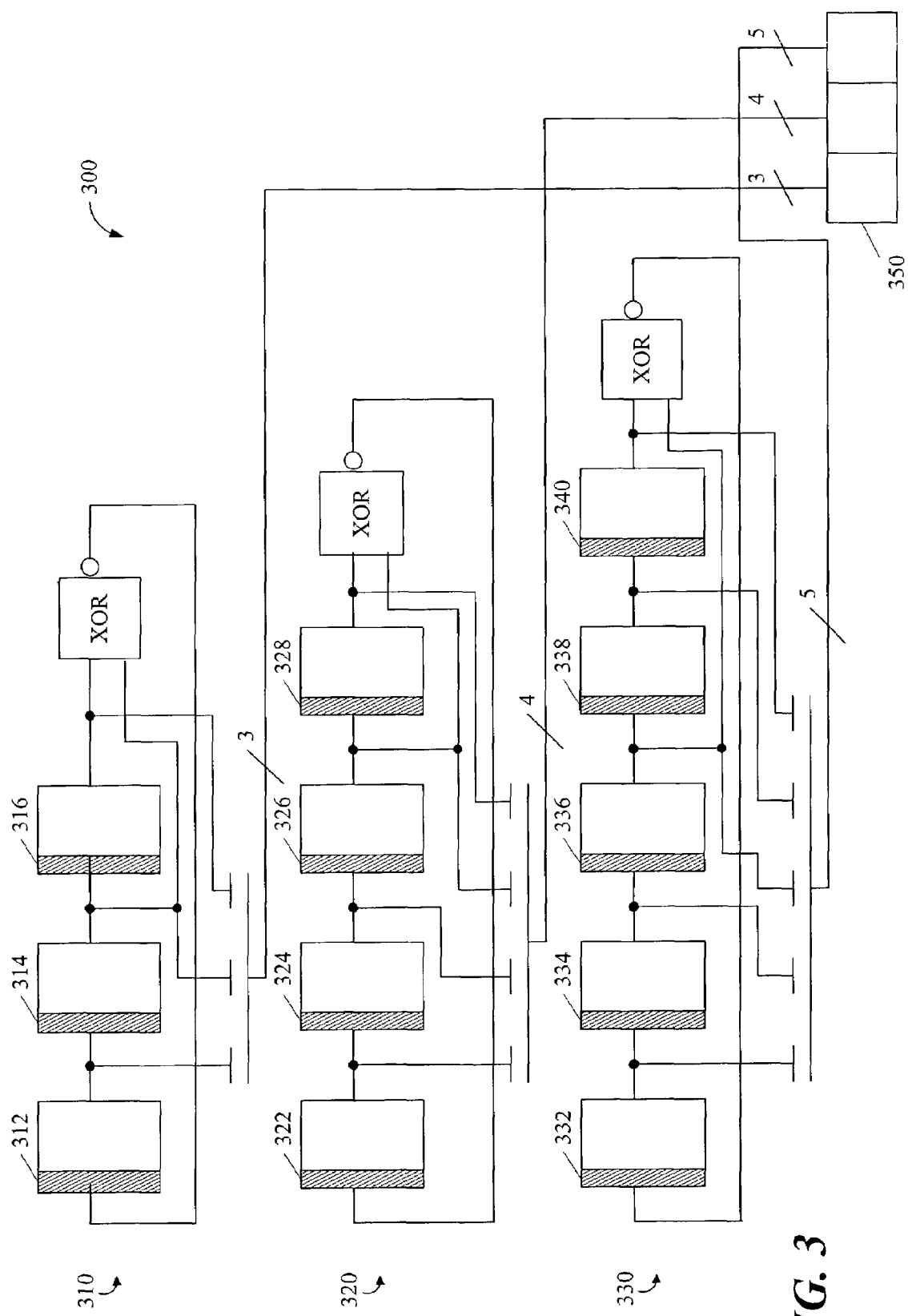
FIG. 3 depicts a three digit LFSR counter that is one embodiment of the present invention.

With reference now to FIG. 3 of the Drawings, there is illustrated therein a representation of a long-period counter using LFSRs, according to the present invention, generally designated by the reference numeral 300. The counter uses three LFSR counters, 310, 320, and 330, each of maximal period configuration. The LFSR counters are explained in more detail, hereinbelow.

The first LFSR counter 310 has three registers 312, 314, and 316, and, according the formula of maximal period, has a period of $2^3-1$ or 7. Table I shows the LFSR bit patterns and equivalent decimal count values for the counter 310.

TABLE I

| c | $i_3$ | $i_2$ | $i_1$ |
|---|---|---|---|
| 0 | {0, | 0, | 0} |
| 1 | {1, | 0, | 0} |
| 2 | {1, | 1, | 0} |
| 3 | {0, | 1, | 1} |
| 4 | {1, | 0, | 1} |
| 5 | {0, | 1, | 0} |
| 6 | {0, | 0, | 1} |

The second LFSR counter 320 has four registers, 322, 324, 326, and 328, and, according the formula of maximal period, has a period of $2^4-1$ or 15. Table II shows the LFSR bit patterns and equivalent decimal count values for the counter 320.

TABLE II

| c | $j_4$ | $j_3$ | $j_2$ | $j_1$ |
|---|---|---|---|---|
| 0 | {0, | 0, | 0, | 0} |
| 1 | {1, | 0, | 0, | 0} |
| 2 | {1, | 1, | 0, | 0} |
| 3 | {1, | 1, | 1, | 0} |
| 4 | {0, | 1, | 1, | 1} |
| 5 | {1, | 0, | 1, | 1} |
| 6 | {1, | 1, | 0, | 1} |
| 7 | {0, | 1, | 1, | 0} |
| 8 | {0, | 0, | 1, | 1} |
| 9 | {1, | 0, | 0, | 1} |
| 10 | {0, | 1, | 0, | 0} |
| 11 | {1, | 0, | 1, | 0} |
| 12 | {0, | 1, | 0, | 1} |
| 13 | {0, | 0, | 1, | 0} |
| 14 | {0, | 0, | 0, | 1} |

The third LFSR counter 330 has five registers, 332, 334, 336, 338, and 340, and, according the formula of maximal period, has a period of $2^5-1$ or 31. Table III shows the LFSR bit patterns and equivalent decimal count values for the counter 330.

TABLE III

| c | $k_5$ | $k_4$ | $k_3$ | $k_2$ | $k_1$ |
|---|---|---|---|---|---|
| 0 | {0, | 0, | 0, | 0, | 0} |
| 1 | {1, | 0, | 0, | 0, | 0} |
| 2 | {1, | 1, | 0, | 0, | 0} |
| 3 | {1, | 1, | 1, | 0, | 0} |
| 4 | {0, | 1, | 1, | 1, | 0} |
| 5 | {0, | 0, | 1, | 1, | 1} |
| 6 | {1, | 0, | 0, | 1, | 1} |
| 7 | {0, | 1, | 0, | 0, | 1} |
| 8 | {0, | 0, | 1, | 0, | 0} |
| 9 | {0, | 0, | 0, | 1, | 0} |
| 10 | {1, | 0, | 0, | 0, | 1} |
| 11 | {0, | 1, | 0, | 0, | 0} |
| 12 | {1, | 0, | 1, | 0, | 0} |
| 13 | {0, | 1, | 0, | 1, | 0} |
| 14 | {1, | 0, | 1, | 0, | 1} |
| 15 | {1, | 1, | 0, | 1, | 0} |
| 16 | {1, | 1, | 1, | 0, | 1} |
| 17 | {1, | 1, | 1, | 1, | 0} |
| 18 | {0, | 1, | 1, | 1, | 1} |
| 19 | {1, | 0, | 1, | 1, | 1} |
| 20 | {1, | 1, | 0, | 1, | 1} |
| 21 | {0, | 1, | 1, | 0, | 1} |
| 22 | {1, | 0, | 1, | 1, | 0} |
| 23 | {0, | 1, | 0, | 1, | 1} |
| 24 | {0, | 0, | 1, | 0, | 1} |
| 25 | {1, | 0, | 0, | 1, | 0} |
| 26 | {1, | 1, | 0, | 0, | 0} |
| 27 | {0, | 1, | 1, | 0, | 0} |
| 28 | {0, | 0, | 1, | 1, | 0} |
| 29 | {0, | 0, | 0, | 1, | 1} |
| 30 | {0, | 0, | 0, | 0, | 1} |

The three LFSR counters 310, 320, and 330 are independent from one another and there are no carry connections or other logic signals between them. It should be apparent to those skilled in the art that adding yet a fourth counter, or more, would have no direct effect on the operation of the other counters. The total period of the aggregate counter composed of the three LFSR counters is the product of all the counter periods or 7×15×31 or 3255. This is an equivalent period between that of an eleven register counter, $2^{11}-1$ or 2047, and a twelve register counter, $2^{12}-1$ or 4097.

With reference again to FIG. 3, the counter 300 produces a three digit output 350, where each digit carries a particular weight. The counters 310, 320, and 330 are initialized with the value 0, and then allowed to count freely. It should be understood that the counters do not count sequentially, but do follow a specific pattern. Thus, at any time, the output 350 of the counter will be in a pseudorandom form that can be easily referenced to a lookup table that relates the pseudorandom number to its actual decimal value.

Table IV shows an abbreviated map of the output of the counter 300 to the corresponding decimal value. Also shown in Table IV is the weight of each digit. The weight $w_k$ of the k-digit is 1365, the weight $w_i$ of the i-digit is 2325, and the weight $w_j$ of the j-digit is 2821. The weights of the digits can be used to find the exact decimal value of the output. For example, the output {4, 2, 28} has the decimal value 3252, where the decimal value can be calculated by (i $w_i$+j $w_j$+k $w_k$) MOD (p, $p_j$ $p_k$); $p_i$ is the period of i, $p_j$ is the period of j, and $p_k$ is the period of k.

TABLE IV

| c | i | j | k |
|---|---|---|---|
| {0, | 0, | 0, | 0} |
| {1, | 1, | 1, | 1} |
| {2, | 2, | 2, | 2} |
| {3, | 3, | 3, | 3} |
| {4, | 4, | 4, | 4} |
| {5, | 5, | 5, | 5} |
| {6, | 6, | 6, | 6} |
| {7, | 0, | 7, | 7} |
| {8, | 1, | 8, | 8} |
| ... | | | |
| {1364, | 6, | 14, | 0} |
| {1365, | 0, | 0, | 1} |
| {1366, | 1, | 1, | 2} |
| ... | | | |
| {2324, | 0, | 14, | 30} |
| {2325, | 1, | 0, | 0} |
| {2326, | 2, | 1, | 1} |
| ... | | | |
| {2820, | 6, | 0, | 30} |
| {2821, | 0, | 1, | 0} |
| {2822, | 1, | 2, | 1} |
| ... | | | |
| {3252, | 4, | 12, | 28} |
| {3253, | 5, | 13, | 29} |
| {3254, | 6, | 14, | 30} |
| {0, | 0, | 0, | 0} |

The weights or decimal values of the digits can be calculated using the following code in C:

```
int moduli[3] = {
    7, 15, 31 // moduli must be relatively prime
};
int numModuli = sizeof(moduli) / sizeof (moduli[0] );
main ( )
{
    int M=1; // The product of all moduli
    int Mi; // The product of all moduli except modulus i
    int modWgt; // The weight of a modulus
    int i;
    for (i=0; i<numModuli;i++) // calc the product of all moduli
        M *= moduli [i] ;
    for (i=0; i<numModuli; i++) { // For each modulus i, calc modWgt
        Mi=M / moduli [i] ;
        modWgt=Mi;
        while (modWgt%moduli [i] != 1) // note: at most moduli[i] −1
            tests modWgt = (modWgt + Mi) % M;
        printf("For modulus %d (%2d) , modulus weight = %d\n",
            i, moduli [i] , modWgt;
    }
    exit (0);
}
```

This code can be easily modified to calculate the decimal values for different digit counters of any period. For a four digit counter of period 3×7×15×31 or 9765, where the digits have periods of 3, 7, 15, and 31, the first two lines of the code can be rewritten:

```
int moduli[4] = {
    3, 7, 15, 31    // moduli must be relatively prime
};
```

The three counters 310, 320, and 330 are shown in FIG. 3 together. However, it should be understood that the three LFSR counters do not need physical proximity to operate. Different digits can even be located on different chips in a multi-chip system without affecting the overall performance of the system.

The example described hereinabove illustrates the substantial benefit of using multiple LFSR counters with small numbers of registers. In the case of the year-long counter, which requires a 55-bit conventional counter, the method of using multiple LFSR counters provides a greater benefit.

By using twelve small period LFSR counters with periods relatively prime to each other, a counter with a total period of roughly $1.55186 \times 10^{17}$ can be realized. The period is approximately equivalent to a binary counter with 57 bits. In this example, the twelve prime numbers used for the periods of the small period LFSR counters are {11, 13, 17, 19, 23, 29, 31, 37, 41, 43, 47, 53}. It should be understood that the specific tap sequences for the small period LFSR counters of this embodiment are not counters configured for a maximal period, but are instead configured for the particular periods necessary. The tap sequences for the particular periods can be found through trial-and-error, or the counters can be built so that, when configured for a maximal period, the counter is reset to an initial value when the counter reaches a value that corresponds to the maximum value of the particular period necessary.

For other counters using small period LFSR counters with different periods, the tap sequences are known and are listed, for example, in "Shift Register Sequences," S. Golomb, Holden Day, 1967.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A long period counter comprising:
    a digit register holding a count for said long period counter wherein a decimal equivalent of said count is recovered using at least one of residue arithmetic or table lookup; and
    a plurality of digit counters, connected to said digit register in parallel, each digit counter having a fixed, repeating sequence of numbers, each sequence of numbers having a period relatively prime to each period of said sequence of numbers of each other digit counter.

2. The counter according to claim 1, wherein said counter has a period which is a product of the periods of said plurality of digit counters.

3. The counter according to claim 1, wherein each digit counter is a linear feedback shit register counter.

4. The counter according to claim 3, wherein each digit counter uses a particular tap sequence, each tap sequence determining the period of the digit counter.

5. A long period counter comprising:
   means for counting a plurality of digits in parallel, each digit of a different base; and
   means for combining said plurality of digits into a multi-digit output wherein said multi-digit output is converted to decimal through at least one of residue arithmetic or table lookup.

6. The counter according to claim 5, wherein each base is a relative prime of each other base.

7. A method for long period counting, said method comprising the steps of:
   counting a plurality of digits in parallel, each digit of a different base; and
   combining said plurality of digits into a multi-digit output wherein said multi-digit output is converted to decimal through at least one of residue arithmetic or table lookup.

8. The method according to claim 7, wherein each base is a relative prime of each other base.

* * * * *

UNITED STATES PATENT AND TRADEMARK OFFICE
CERTIFICATE OF CORRECTION

PATENT NO. : 7,082,453 B1
APPLICATION NO. : 10/255611
DATED : July 25, 2006
INVENTOR(S) : J. Barry Shackleford et al.

It is certified that error appears in the above-identified patent and that said Letters Patent is hereby corrected as shown below:

In column 5, line 54, delete "(moduli[O])" and insert -- (moduli[0]) --, therefor.

In column 7, line 5, in Claim 3, delete "shit" and insert -- shift --, therefor.

Signed and Sealed this

Third Day of March, 2009

JOHN DOLL
*Acting Director of the United States Patent and Trademark Office*